United States Patent
Chi

(10) Patent No.: US 9,153,339 B2
(45) Date of Patent: Oct. 6, 2015

(54) SEMICONDUCTOR DEVICE AND SEMICONDUCTOR MEMORY DEVICE

(71) Applicant: SK hynix Inc., Gyeonggi-do (KR)

(72) Inventor: Sung-Soo Chi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/109,624

(22) Filed: Dec. 17, 2013

(65) Prior Publication Data

US 2014/0347909 A1   Nov. 27, 2014

(30) Foreign Application Priority Data

May 27, 2013   (KR) .................. 10-2013-0059483

(51) Int. Cl.
*G11C 17/18* (2006.01)
*G11C 17/16* (2006.01)

(52) U.S. Cl.
CPC ............ *G11C 17/18* (2013.01); *G11C 17/16* (2013.01)

(58) Field of Classification Search
USPC ........................................................ 365/96
See application file for complete search history.

(56) References Cited

U.S. PATENT DOCUMENTS

| 5,808,944 A * | 9/1998 | Yoshitake et al. ............. 365/200 |
| 2006/0039210 A1* | 2/2006 | Blodgett ....................... 365/200 |

FOREIGN PATENT DOCUMENTS

| KR | 1020070095563 | 10/2007 |
| KR | 1020090022292 | 3/2009 |
| KR | 1020100096861 | 9/2010 |
| KR | 1020110012401 | 2/2011 |
| KR | 1020110121184 | 11/2011 |
| KR | 1020120052454 | 5/2012 |
| KR | 1020120052564 | 5/2012 |

* cited by examiner

*Primary Examiner* — Anthan Tran
(74) *Attorney, Agent, or Firm* — IP & T Group LLP

(57) ABSTRACT

A semiconductor device includes a fuse array having a plurality of fuse sets suitable for outputting a plurality of fuse status signals having different levels according to whether fuses of the plurality of fuse sets are cut or not, a code counter suitable for counting selection codes in a preset order in response to an enable signal and an operation clock, and storage blocks suitable for receiving and storing the plurality of fuse status signals in a preset order in response to the selection codes.

7 Claims, 7 Drawing Sheets

SEMICONDUCTOR DEVICE AND SEMICONDUCTOR MEMORY DEVICE

CROSS-REFERENCE TO RELATED APPLICATIONS

The present application claims priority of Korean Patent Application No. 10-2013-0059483, filed on May 27, 2013, which is incorporated herein by reference in its entirety.

BACKGROUND

1. Field

Exemplary embodiments of the present invention generally relate to a semiconductor design technology, and more particularly, to a circuit for storing fuse options in a semiconductor device.

2. Description of the Related Art

A large number of fuse options may be used in a semiconductor device. For example, in a semiconductor memory device, fuse options may be used to analyze a circuit design and to repair a failed memory cell. To repair a failed memory cell, a normal memory cell is selected when a fuse is not cut, and a redundancy memory cell is selected when the fuse is cut.

Generally, a fuse may be cut using laser equipment, by heavy current, or as high voltage flows through the fuse. To repair a fail, the fuse may be cut.

In an embodiment according to the present invention, storing the fuse options in a storage circuit, such as a register, may be performed prior to the operation of the semiconductor device. A preset operation may then be performed by obtaining the fuse options from the storage circuit in the semiconductor device to determine whether the fuse is cut or not. This advantageously allows the fuse options to be quickly obtained by the preset operation rather than waiting for the preset operation to obtain the fuse options from outside of the semiconductor each time the preset operation is performed.

SUMMARY

Various embodiments according to the present invention are presented that describe a storage circuit capable of quickly and efficiently storing fuse options.

In an embodiment according to the present invention, a semiconductor device may include a fuse array including M number of fuse sets suitable for outputting M number of fuse status signals having different levels according to whether the fuses of the M number of fuse sets are cut or not, a code counter suitable for counting selection codes in a preset order in response to an enable signal and an operation clock, and storage blocks suitable for receiving and storing the M number of fuse status signals in a preset order in response to the selection codes.

In another embodiment according to the present invention, a semiconductor memory device may include N number of banks, fuse arrays including N*M number of fuse sets which correspond to the N number of banks by the unit of M number, and suitable for outputting N*M number of fuse status signals that have different levels according to whether fuses of the N*M number of fuse sets are cut or not, a code counter suitable for counting selection codes in a preset order by M number of times in response to an enable signal and an operation clock and to be initialized in response to a group selection signal and N numbers of storage blocks suitable for receiving and storing the N*M number of fuse status signals in a preset order by the unit of M number, according to the group selection signal and the selection codes.

In another embodiment according to the present invention, a semiconductor memory device may include a fuse array having a plurality of fuse sets, the fuse array suitable for outputting a plurality of fuse status signals having different levels according to whether fuses in the plurality of fuse sets are cut or not, a code counter suitable for counting selection codes in a preset order in response to an enable signal and an operation clock and a plurality of storage blocks suitable for receiving and storing the plurality of fuse status signals in a preset order in response to the selection codes.

In another embodiment according to the present invention, a semiconductor memory device may include a plurality of banks, a plurality of banks, a plurality of fuse arrays having a plurality of fuse sets which correspond to the plurality of banks, and suitable for outputting a plurality of fuse status signals which have different levels according to whether fuses of the plurality of fuse sets are cut or not, a code counter suitable for counting selection codes in a preset order in response to an enable signal and an operation clock, and to be initialized in response to a group selection signal, and a plurality of storage blocks suitable for receiving and storing the plurality of fuse status signals in a preset order according to the group selection signal and the selection codes.

The above embodiments according to the present invention advantageously permit a large number of fuse options to be efficiently and quickly stored by shifting signals for storing the fuse options in a preset order in response to toggling an operation clock.

Another advantage is that a large number of fuse options may be efficiently and quickly stored, thereby minimizing storage area by counting signals for storing the fuse options in a preset order in response to toggling of an operation clock.

DETAILED DESCRIPTION

Figure 1:
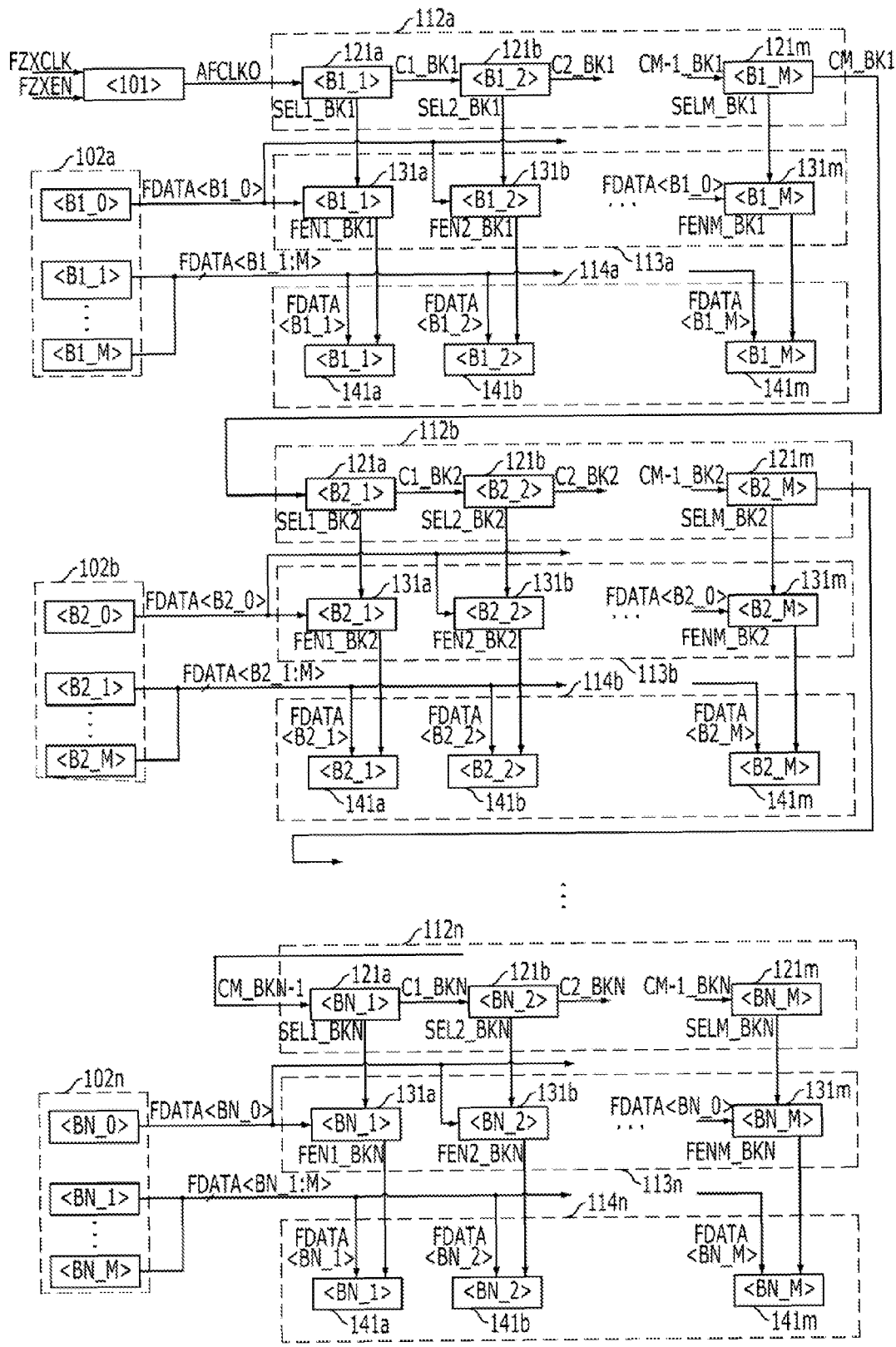
FIG. 1 is a diagram illustrating the configuration of a storage circuit for storing informations of fuse options in accordance with an embodiment of the present invention.

Various embodiments according to the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

FIG. 1 is a diagram illustrating a storage circuit for storing fuse options.

Referring to FIG. 1, a storage circuit for storing fuse options may include a clock buffer 101, N number of fuse arrays 102a, 102b, ..., 102n, N number of fuse selection decoding blocks 112a, 112b, ..., 112n, and N numbers of storage blocks 113a, 113b, ..., 113n/114a, 114b, ..., 114n. The N number of respective fuse arrays 102a, 102b, ..., 102n include M numbers of fuse sets 110a, ..., 110m. The N number of respective fuse arrays 102a, 102b, ..., 102n further includes valid fuse sets 100a. The N number of respective fuse selection decoding blocks 112a, 112b, ..., 112n include M numbers of fuse selection decoders 121a, 121b, ..., 121m. The N numbers of respective storage blocks 113a, 113b, ..., 113n include M numbers of selectors 131a, 131b, ..., 131m and M numbers of latches 141a, 141b, ..., 141m. For reference, the semiconductor device may include N number of banks, N number of fuse arrays 102a, 102b, ..., 102n, N number of fuse selection decoding blocks 112a, 112b, ..., 112n, and N numbers of storage blocks 113a, 113b, ..., 113n and 114a, 114b, ..., 114n. The components correspond to the N number of banks. Since the variables N and M have values selected by a designer the semiconductor device may have a variety of configurations.

The clock buffer 101 is suitable for buffering an external clock FZXCLK based on an enable signal FZXEN. The clock buffer 101 buffers the external clock FZXCLK as an operation clock AFCLK0 during a period in which the enable signal FZXEN is activated, and transmits the operation clock AFCLK0 to the N number of fuse selection decoding blocks 112a, 112b, ..., 112n, thereby allowing an operation to be performed in such a manner that N*M number of fuse status signals, that is, FDATA<B1_1>, FDATA<B1_2>, ..., FDATA<B1_M>/FDATA<B2_1>, FDATA<B2_2>, ..., FDATA<B2_M>/ ... /FDATA<BN_1>, FDATA<BN_2>, ..., FDATA<BN_M> (hereinafter referred to as FDATA or fuse status signals) are outputted from the M numbers of fuse sets 110a, ..., 110m included in the N number of respective fuse arrays 102a, 102b, ..., 102n and are stored in the M numbers of latches 141a, 141b, ..., 141m, which are included in the N number of respective storage blocks 114a, 114b, ..., 114n.

Each of the M numbers of fuse sets 110a, 110b, ..., 110m and a valid fuse set 100a may be included in the N number of respective fuse arrays 102a, 102b, ..., 102n. Therefore a N*M number of fuse status signals and a N number of valid fuse status signals may have different levels according to whether the fuses included in the fuse sets are cut or not. For example, a fuse status signal outputted from a fuse set in which a fuse included therein is cut has a value of a logic low level. Conversely, a fuse status signal outputted from a fuse set in which an included fuse is not cut has a value of a logic high level. Of course, the detailed configuration of each of the M*N number of fuse sets 110a, 110b, ..., 110m and a N number of valid fuse sets 100a is an exemplary embodiment according to the present invention, and may be configured differently.

The N number of valid fuse status signals FDATA respectively outputted from the valid fuse set 100a, which is respectively included in the N number of fuse arrays 102a, 102b, ..., 102n represent whether or not the N*M number of fuse status signals FDATA outputted from the N*M number of fuse sets 110a, 110b, ..., 110m are valid. That is, the N*M number of fuse status signals FDATA outputted from the first to $M^{th}$ fuse sets 110a, 110b, ..., 110m included in the N number of respective fuse arrays 102a, 102b, ..., 102n are divided N number of times by the M number, and whether or not the respective M numbers of fuse status signals FDATA are valid is determined N number of times. If each M number of fuse status signals FDATA are all valid, the valid fuse status signal FDATA outputted from the valid fuse set 100a corresponding to each M number of fuse status signals will become a logic high level. Conversely, if each M number of fuse status signals FDATA are partially invalid, the valid fuse status signal outputted from the valid fuse set 100a corresponding to each M number of fuse status signals FDATA will become a logic low level. For example, if an invalid fuse status signal is included in the seventh number of fuse status signals among the N*M number of fuse status signals outputted from the first to $M^{th}$ fuse sets 110a, 110b, ..., 110m included in the N number of fuse arrays 102a, 102b, ..., 102n, the seventh valid fuse status signal outputted from the seventh valid fuse set corresponding to the seventh M number of fuse status signals will become the logic low level, and the remaining N−1 number of fuse status signals outputted from the remaining N−1 number of valid fuse sets 100a included in the N number of fuse arrays 102a, 102b, ..., 102n, will become the logic high level.

In this way, validities of the M numbers of fuse sets 110a, 110b, ..., 110m respectively included in the N number of fuse arrays 102a, 102b, ..., 102n may be determined according to the N number of valid fuse status signals FDATA outputted from the valid fuse sets 100a included in the N number of fuse arrays 102a, 102b, ..., 102n.

For reference, the values of the N number of valid fuse status signals outputted from the N number of valid fuse sets 100a respectively included in the N number of fuse arrays 102a, 102b, ..., 102n may be determined through a test during fabrication of a semiconductor device. Whether or not the N number of valid fuse sets 100a are included in the N number of fuse arrays 102a, 102b, ..., 102n may be determined by design. That is a configuration may be made such that only the M numbers of fuse sets 110a, 110b, ..., 110m are included and the valid fuse sets 100a are not included in the N number of fuse arrays 102a, 102b, ..., 102n. In the case where the valid fuse sets 100a are not included, whether or not the M numbers of fuse sets 110a, 110b, ..., 110m included in the N number of fuse arrays 102a, 102b, ..., 102n are valid may not be determined.

Figure 5:
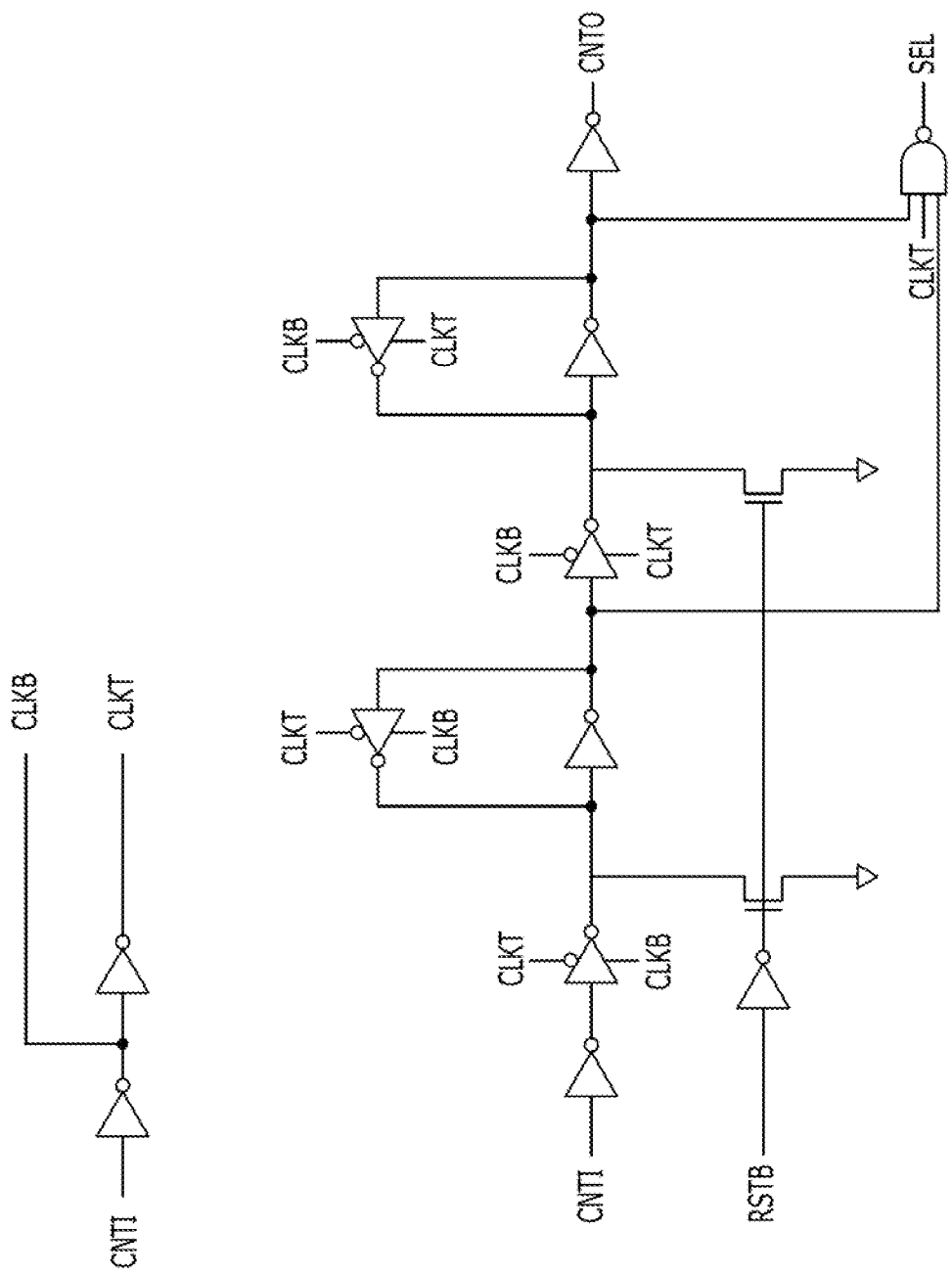
FIG. 5 is a diagram illustrating a fuse selection decoder in a storage circuit according to an embodiment of the present invention.

The M numbers of fuse selection decoders 121a, 121b, ..., 121m included in the N number of respective fuse selection decoding blocks 112a, 112b, ..., 112n selectively enable the M numbers of selectors 131a, 131b, ..., 131m and the M numbers of latches 141a, 141b, ..., 141m, which are included in the N numbers of respective storage blocks 113a, 113b, ..., 113n and 114a, 114b, ..., 114n, based on the operation clock AFCLK0 transmitted from the clock buffer 101. FIG. 5 illustrates a detailed configuration of each of the M numbers of fuse selection decoders 121a, 121b, ..., 121m included in the N number of respective fuse selection decoding blocks 112a, 112b, ..., 112n. Referring to FIG. 5 when an inputted clock CNTI consecutively toggles, an operation of shifting the inputted clock CNTI after the inputted clock CNTI toggles a preset number of times, as a clock CNTO to be outputted, is performed. Accordingly, an operation is performed so that the M numbers of fuse selection decoders 121a, 121b, ..., 121m included in the N number of respective fuse selection decoding blocks 112a, 112b, . . . , 112n may be sequentially selected corresponding to the toggling of the operation clock AFCLK0, which is applied to the fuse selection decoder 121a that is disposed foremost. Further, an operation is performed so that N*M number of selection signals SEL1:M for selectively enabling the M numbers of selectors 131a, 131b, . . . , 131m and the M numbers of latches 141a, 141b, . . . , 141m, which are included in the N numbers of respective storage blocks 113a, 113b . . . , 113n and 114a, 114b, . . . , 114n are sequentially activated in the course where the inputted clock CNTI is shifted as the clock CNTO to be outputted.

In summary, the M numbers of fuse selection decoders 121a, 121b, . . . , 121m included in the N number of respective fuse selection decoding blocks 112a, 112b, . . . , 112n operate so that all the N*M numbers of fuse selection decoders 121a, 121b, . . . , 121m may be sequentially selected by one time, through a scheme of sequentially shifting the operation clock AFCLK0 transmitted from the clock buffer 101. Therefore, every time the M numbers of fuse selection decoders 121a, 121b, . . . , 121m included in the N number of respective fuse selection decoding blocks 112a, 112b, . . . , 112n are selected one by one, the M numbers of selectors 131a, 131b, . . . , 131m and the M numbers of latches 141a, 141b, . . . , 141m that are included in the N numbers of respective storage blocks 113a, 113b, . . . , 113n and 114a, 114b, . . . , 114n are enabled one by one and store the N*M number of fuse status signals, respectively. The detailed configuration, illustrated in FIG. 5, of each of the M numbers of fuse selection decoders 121a, 121b, . . . , 121m included in the N number of respective fuse selection decoding blocks 112a, 112b, . . . , 112n is an exemplary embodiment, and may have a variety of configurations.

Figure 6:
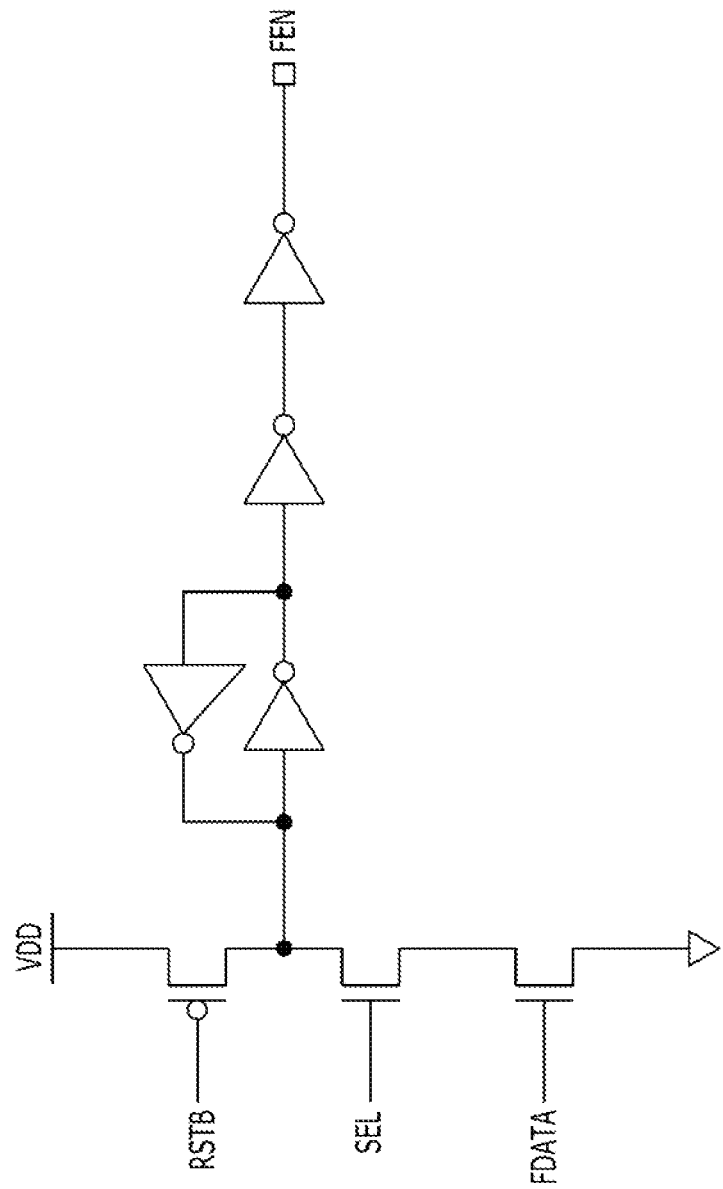
FIG. 6 is a diagram illustrating a selector in a storage circuit according to an embodiment of the present invention.

The M numbers of selectors 131a, 131b, . . . , 131m included in the N number of respective storage blocks 113a, 113b, . . . , 113n, determine whether or not to activate N*M number of storage enable signals FEN based on the N*M number of selection signals SEL1:M outputted from the M numbers of fuse selection decoders 121a, 121b, . . . , 121m included in the N number of respective fuse selection decoding blocks 112a, 112b, . . . , 112n in the case where the N number of valid fuse status signals outputted from the n number of valid fuse sets 100a are valid, so that the M numbers of latches 141a, 141b, . . . , 141m included in the N number of respective storage blocks 114a, 114b, . . . , 114n are selectively enabled. FIG. 6 illustrates a detailed configuration of each of the M numbers of selectors 131a, 131b, . . . , 131m included in the N number of respective storage blocks 113a, 113b, . . . , 113n. That is, in the state in which the N*M number of storage enable signals FEN are initialized to a logic low level based on a reset signal RSTB, the N*M number of storage enable signals are sequentially activated to a logic high level based on that the N number of valid fuse status signals FDATA, outputted from the N number of valid fuse sets 100a included in the N number of fuse arrays 102a, 102b, . . . , 102n and become valid as the logic high level. At the same time the N*M number of selection signals outputted from the M numbers of fuse selection decoders 121a, 121b, . . . , 121m included in the N number of respective fuse selection decoding blocks 112a, 112b, . . . , 112n are activated to a logic high level in a preset order. The detailed configuration, illustrated in FIG. 6, of each of the M numbers of selectors 131a, 131b, . . . , 131m included in the N number of respective storage blocks 113a, 113b, . . . , 113n is an exemplary embodiment and may have a variety of configurations.

Figure 7:
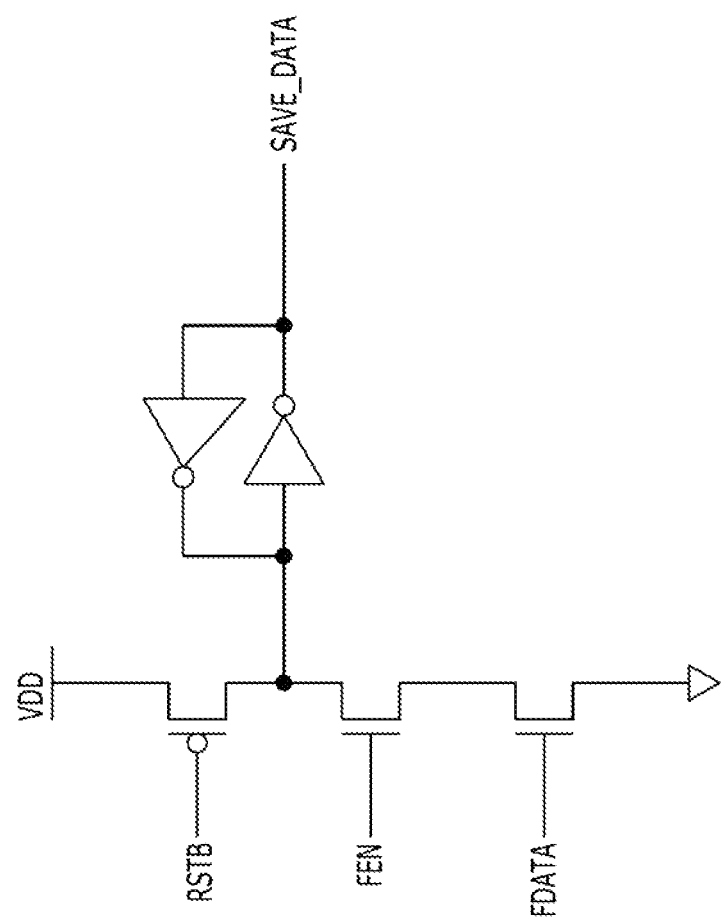
FIG. 7 is a diagram illustrating a latch in a storage circuit according to an embodiment of the present invention.

The M numbers of latches 141a, 141b, . . . , 141m included in the N number of respective storage blocks 114a, 114b, . . . , 114n store N*M number of fuse status signals FDATA outputted from the N*M number of fuse sets 110a, 110b, . . . , 110m respectively included in the N number of fuse arrays 102a, 102b, . . . , 102n, in response to the storage enable signals FEN outputted from the M numbers of selectors 131a, 131b, . . . , 131m included in the N number of respective storage blocks 113a, 113b, . . . , 113n. FIG. 7 illustrates a detailed configuration of each of the N*M number of latches 141a, 141b, . . . , 141m. When the N*M number of storage enable signals FEN are activated to the logic high level in the preset order on the basis of a save value SAVE_DATA, which is initialized to a logic high level based on the reset signal RSTB, whether to store the save value SAVE_DATA as the logic high level or a logic low level is determined based on the N*M number of fuse status signals FDATA. The detailed configuration, which is illustrated in FIG. 7, of each of the M numbers of latches 141a, 141b, . . . , 141m included in the N number of storage blocks 114a, 114b, . . . , 114n is an exemplary embodiment and may have a variety of configurations.

As described above, the storage circuit for storing fuse options sequentially stores the N*M number of fuse status signals of which levels are determined by whether the fuses respectively included in the M numbers of fuse sets 110a, 110b, . . . , 110m that are included in the N number of respective fuse arrays 102a, 102b, . . . , 102n are cut or not.

While a component element for generating the enable signal FZXEN is not directly shown in FIG. 1, the activation period of the enable signal FZXEN may be defined on the basis of the fact that the operation of the storage circuit for storing information of fuse options is performed during an initial operation period. The enable signal FZXEN is activated based on a power-up signal (not shown) indicating a time at which an internal voltage of a semiconductor device is stabilized, and FZXEN is deactivated after all the M numbers of selectors 131a, 131b, . . . , 131m and the M numbers of latches 141a, 141b, . . . , 141m included in the N numbers of respective storage blocks 113a, 113b, . . . , 113n and 114a, 114b, . . . , 114n are selected by one time and thus all the N*M number of fuse status signals are stored.

In the storage circuit for storing fuse options illustrated in FIG. 1, to sequentially select the N*M number of latches 141a, 141b, . . . , 141m included in the N number of storage blocks 114a, 114b, . . . , 114n for storing the N*M number of fuse status signals, the shifting of the inputted operation clock AFCLK0 is used. That is, shifting the operation clock AFCLK0 by the N*M number of times through the M numbers of fuse selection decoders 121a, 121b, . . . , 121m included in the N number of respective fuse selection decoding blocks 112a, 112b, . . . , 112n is used.

Figure 2:
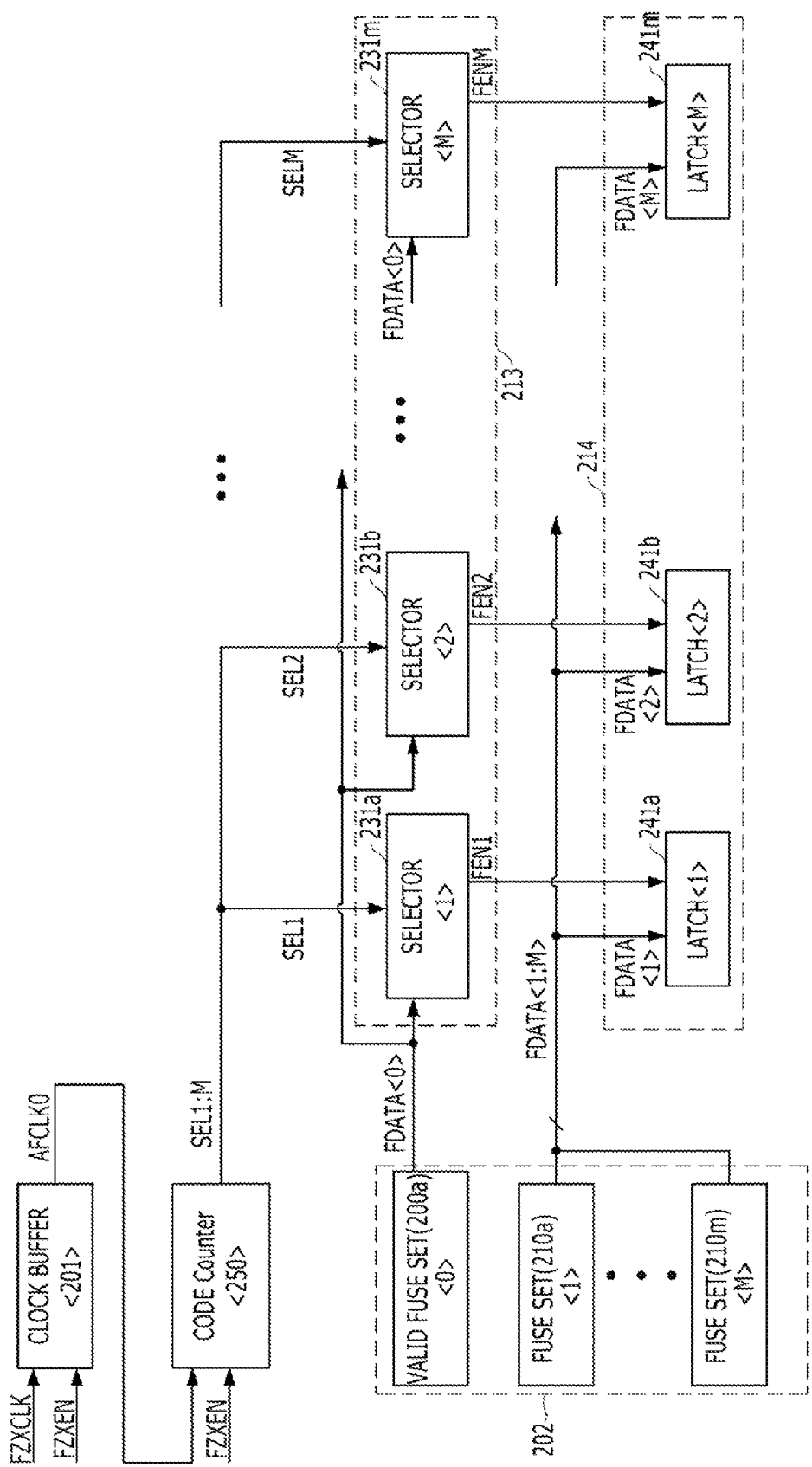
FIG. 2 is a diagram illustrating a storage circuit for storing fuse options according to an embodiment of the present invention.

FIG. 2 is a diagram illustrating a storage circuit for storing fuse options according to an embodiment of the present invention.

Referring to FIG. 2, the storage circuit for storing information of fuse options includes a clock buffer 201, a fuse array 202, a code counter 250, and storage blocks 213 and 214. The fuse array 202 includes M number of fuse sets 210a, 210b, . . . , 210m. The fuse array 21 may include one valid fuse set 200a. The storage blocks 213 and 214 may include M number of selectors 231a, 231b, . . . , 231m and M number of latches 241a, 241b, . . . , 241m.

The clock buffer 201 is suitable for buffering an external clock FZXCLK based on an enable signal FZXEN. The clock buffer 201 buffers the external clock FZXCLK as an operation clock AFCLK0 during a period in which the enable signal FZXEN is activated, and transmits the operation clock AFCLK0 to the code counter 250, thereby allowing an operation to be performed in such a manner that M number of fuse status signals such as FDATA are outputted from the M number of fuse sets 210a, 210b, . . . , 210m included in the fuse array 202 and are stored in the M number of latches 241a, 241b, . . . , 241m included in the storage block 214.

Figure 4:
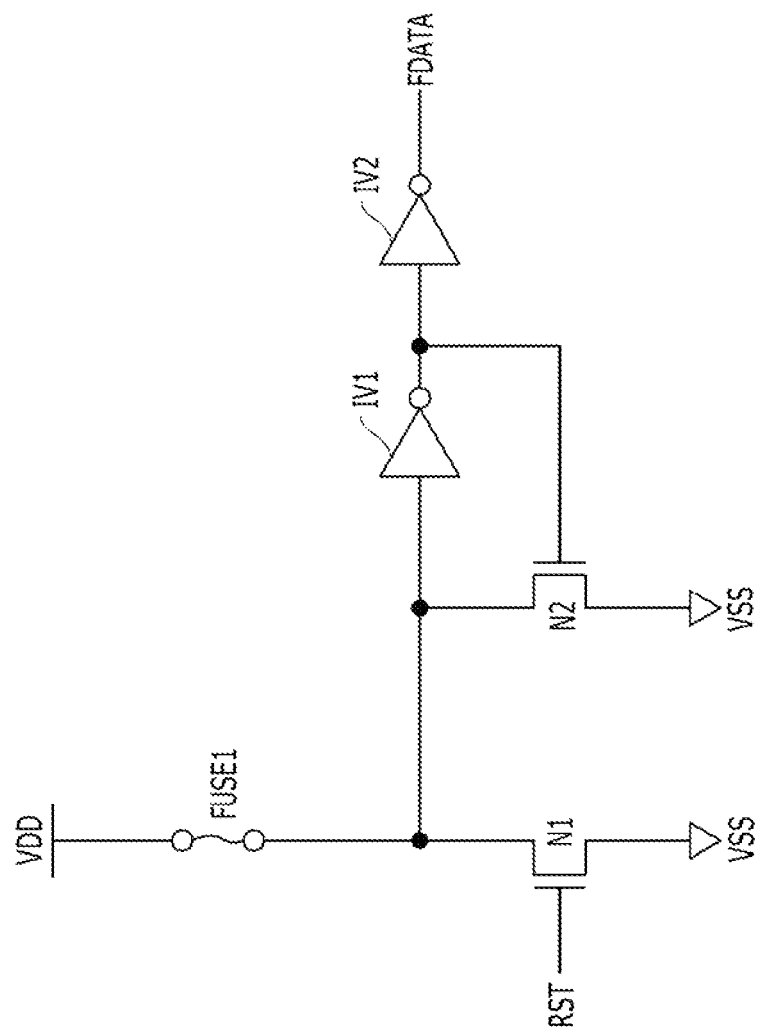
FIG. 4 is a diagram illustrating a storage circuit for storing fuse settings according to an embodiment of the present invention.

Each of the M number of fuse sets 210a, 210b, . . . , 210m and the valid fuse set 200a included in the fuse array 202 may have a circuit as illustrated in FIG. 4. The M number of fuse status signals and a valid fuse status signal have different levels according to whether the fuses included in the fuse sets are cut or not and are outputted. For example, a fuse status signal outputted from a fuse set in which a fuse included therein is cut has the value of a logic low level. Conversely, a fuse status signal outputted from a fuse set in which a fuse included therein is not cut has the value of a logic high level. The detailed configuration of each of the M number of fuse sets 210a, 210b, . . . , 210m and the valid fuse set 200a Illustrated in FIG. 4 is an exemplary embodiment and may have a different configurations.

The valid fuse status signal FDATA<0> outputted from the valid fuse set 200a that is included in the fuse array 202 represents whether or not the M number of fuse status signals outputted from the M number of fuse sets 210a, 210b, . . . , 210m are valid. If all the M number of fuse status signals are valid, the valid fuse status signal outputted from the valid fuse set 200a will become the logic high level. Conversely, if the M number of fuse status signals are partially invalid, the valid fuse status signal outputted from the valid fuse set 200a will become the logic low level.

Therefore validities of the M number of fuse sets 210a, 210b, . . . , 210m included in the fuse array 202 may be determined according to the valid fuse status signal FDATA<0> outputted from the valid fuse set 200a.

The value of the valid fuse status signal FDATA<0> outputted from the valid fuse set 200a included in the fuse array 202 may be determined through a test during the course of fabricating a semiconductor device, and whether or not the valid fuse set 200a is included in the fuse array 202 may be determined during fabrication. Therefore a configuration may be made so that only the M number of fuse sets 210a, 210b, . . . , 210m are included in the fuse array 202 and the valid fuse set 200a may not be included in the fuse array 202. When the valid fuse set 200a is not included, the validity of the M number of fuse sets 210a, 210b, . . . , 210m included in the fuse array 202 may not be determined.

The code counter 250 is suitable for counting selection codes SEL1:M in a preset order based on the enable signal FZXEN and the operation clock AFCLK0. The selection codes SEL1:M counted in the preset order by the code counter 250 selectively enable the M number of selectors 231a, 231b, . . . , 231m and the M number of latches 241a, 241b, . . . , 241m that are included in the storage blocks 213 and 214.

The code counter 250 operates so that the values of the selection codes may be sequentially changed based on toggling of the operation clock AFCLK0 transmitted from the clock buffer 201. As the values of the selection codes are sequentially changed in this way, the M number of selectors 231a, 231b, . . . , 231m and the M number of latches 241a, 241b, . . . , 241m included in the storage blocks 213 and 214 are enabled one by one and store the M number of fuse status signals. Through operations of changing the values of the selection codes in the preset order by M number of times, the M number of selectors 231a, 231b, . . . , 231m and the M number of latches 241a, 241b, . . . , 241m included in the storage blocks 213 and 214 are enabled one by one.

The M number of selectors 231a, 231b, . . . , 231m included in the storage block 213 determine whether or not to activate M number of storage enable signals FEN based on the selection codes SEL1:M counted by the code counter 250 in the case where the valid fuse status signal FDATA<0> outputted from the valid fuse set 200a is valid, so that the M number of latches 241a, 241b, . . . , 241m included in the storage block 214 are selectively enabled. FIG. 6 illustrates a detailed configuration of each of the M number of selectors 231a, 231b, . . . , 231m included in the storage block 213. Storage enable signals are initialized to a logic low level based on a reset signal RSTB, the M number of storage enable signals are sequentially activated to a logic high level in a preset order based on the valid fuse status signal outputted from the valid fuse set 200a and becomes valid as the logic high level. At the same time the selection codes are activated to a logic high level in the preset order. Since the valid fuse status signal applied to the M number of respective selectors 231a, 231b, . . . , 231m serves as a reference for determining whether the M number of fuse status signals are valid or not, if the valid fuse status signal is not valid, it is not necessary to store the M number of fuse status signals. Therefore, when the valid fuse status signal is not valid, the M number of selectors 231a, 231b, . . . , 231m do not perform any operations regardless of the values of the selection codes. The M number of respective selectors 231a, 231b, . . . , 231m perform operations of activating the M number of storage enable signals based on the values of the selection codes when the valid fuse status signal is valid. A detailed configuration, illustrated in FIG. 6, of each of the M number of selectors 231a, 231b, . . . , 231m included in the storage block 213 is an exemplary embodiment, and may have different configurations.

The M number of latches 241a, 241b, . . . , 241m included in the storage block 214 store the M number of fuse status signals outputted from the M number of fuse sets 210a, 210b, . . . , 210m, in response to the M number of storage enable signals outputted from the M number of selectors 231a, 231b, . . . , 231m included in the storage block 213. FIG. 7 illustrates a detailed configuration of each of the M number of latches 241a, 241b, . . . , 241m. When the M number of storage enable signals are activated to the logic high level in the preset order on the basis of a save value SAVE_DATA which is initialized to a logic high level in response to the reset signal RSTB, whether to store the save value SAVE_DATA as the logic high level or a logic low level is determined in response to the M number of fuse status signals. The detailed configuration, illustrated in FIG. 7, of each of the M numbers of latches 241a, 241b, . . . , 241m is an exemplary embodiment and may have different configurations.

As described above, the storage circuit for storing fuse options sequentially stores the M number of fuse status signals the levels of which are determined through whether the fuses respectively included in the M number of fuse sets 210a, 210b, . . . , 210m included in the fuse array 202 are cut or not, in the M number of latches 241a, 241b, . . . , 241m.

While a component element for generating the enable signal FZXEN is not directly shown in FIG. 2, the activation period of the enable signal FZXEN may be defined on the basis that the operation of the storage circuit for storing fuse options is performed at an initial operation period. The enable signal FZXEN is activated in response to a power-up signal (not shown) indicating a time at which an internal voltage of a semiconductor device is stabilized, and is deactivated after all the M number of selectors 231a, 231b, . . . , 231m and the M number of latches 241a, 241b, . . . , 241m included in the storage blocks 213 and 214 are selected by one time and thus all the M number of fuse status signals are stored.

In the storage circuit for storing fuse options shown in FIG. 2, to sequentially select the M number of latches 241a, 241b, ..., 241m for storing the M number of fuse status signals, the selection codes are counted in response to the inputted operation clock AFCLK0.

The code counter 250 always has the same size regardless of the value of number M. Advantageously in the storage circuit for storing fuse options illustrated in FIG. 2, an area to be occupied is not changed as the M number increases since it is only necessary for the code counter 250 to perform a counting operation.

Figure 3:
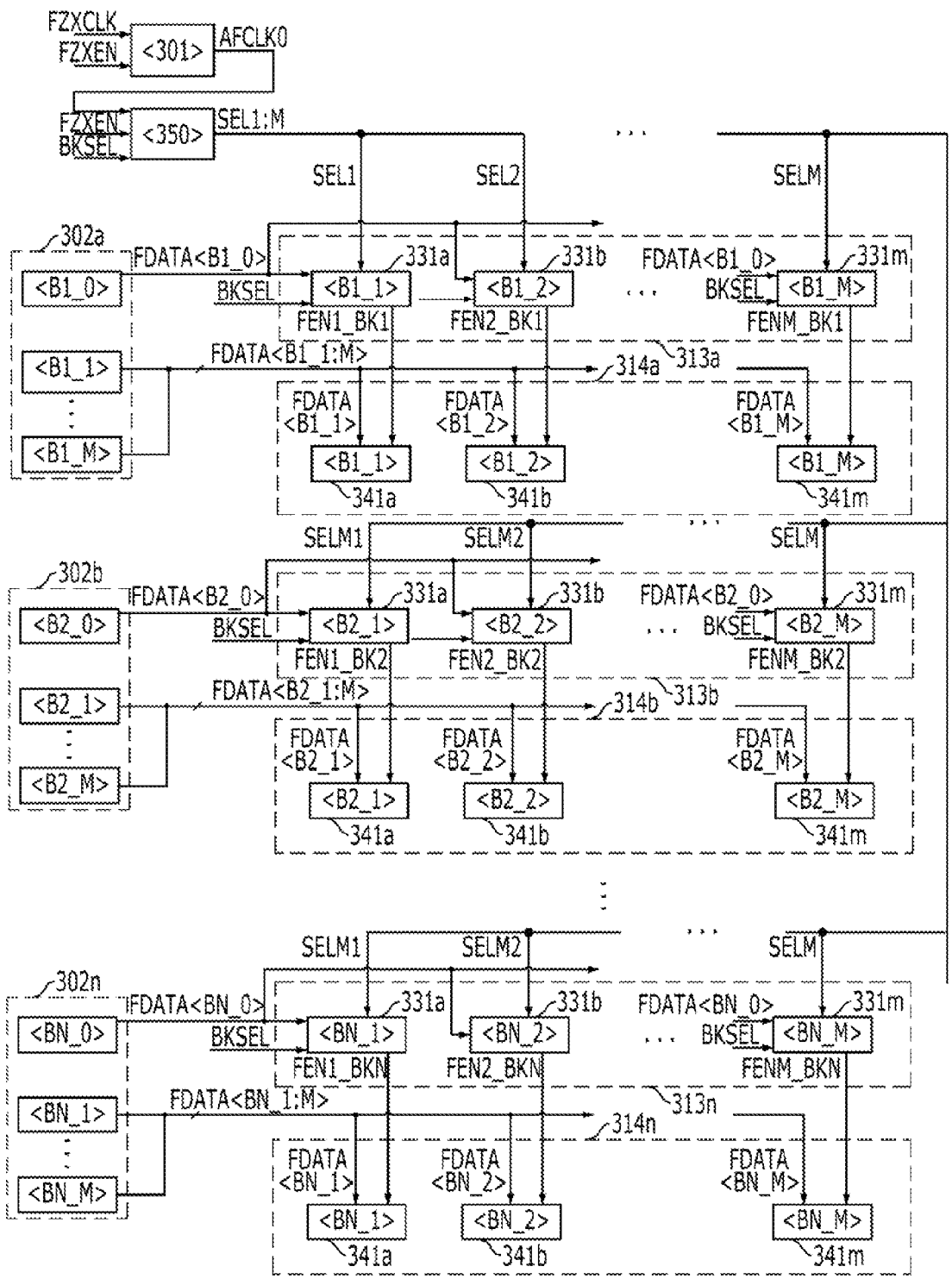
FIG. 3 is a diagram illustrating a storage circuit for storing fuse options according to an embodiment of the present invention.

FIG. 3 is a block diagram illustrating a storage circuit for storing fuse options according to an embodiment of the present invention.

Referring to FIG. 3, the storage circuit for storing fuse options includes a clock buffer 301, N number of fuse arrays 302a, 302b, ..., 302n, a code counter 350, and N numbers of storage blocks 313a, 313b, ..., 313n. The N number of respective fuse arrays 302a, 302b, ..., 302n include M numbers of fuse sets 310a, 310b, ..., 310m. The N number of respective fuse arrays 302a, 302b, ..., 302n may include valid fuse sets 300a. The N numbers of storage blocks 313a, 313b, ..., 313n may include M numbers of selectors 331a, 331b, ..., 331m and M numbers of latches 341a, 341b, ..., 341m. The semiconductor device illustrated in the drawing is a semiconductor memory device which may include N number of banks, N number of fuse arrays 302a, 302b, ..., 302n and N numbers of storage blocks 313a, 313b, ..., 313n that are components, which respectively correspond to the N number of banks. Since the variables N and M are numbers selected by a designer, the semiconductor device in accordance with the present embodiment illustrated in the drawing may be configured in a variety of ways.

The clock buffer 301 may buffer an external clock FZX-CLK in response to an enable signal FZXEN. The clock buffer 301 buffers the external clock FZXCLK as an operation clock AFCLK0 during a period in which the enable signal FZXEN is activated, and transmits the operation clock AFCLK0 to the code counter 350, thereby allowing an operation to be performed in such a manner that N*M number of fuse status signals outputted from the M numbers of fuse sets 310a, 310b, ..., 310m included in the N number of respective fuse arrays 302a, 302b, ..., 302n are stored in the M numbers of latches 341a, 341b, ..., 341m, which are included in the N number of storage blocks 314a, 314b, ..., 314n.

Each of the M numbers of fuse sets 310a, 310b, ..., 310m and the valid fuse sets 300a included in the N number of respective fuse arrays 313a, 313b, ..., 313n may have a circuit as illustrated in FIG. 4. That is N*M number of fuse status signals and N number of valid fuse status signals have different levels according to whether the fuses included therein are cut or not and are outputted. For example, a fuse status signal outputted from a fuse set in which a fuse included therein is cut has the value of a logic low level. Conversely, a fuse status signal outputted from a fuse set in which a fuse included therein is not cut has the value of a logic high level. The detailed configuration of each of the M*N number of fuse sets 310a, 310b, ..., 310m and the N number of valid fuse sets 300a as illustrated in FIG. 4 is an exemplary embodiment and may have a different configurations.

The N number of valid fuse status signals respectively outputted from the valid fuse sets 300a, which are included in the N number of fuse arrays 302a, 302b, ..., 302n represent whether or not the N*M number of fuse status signals outputted from the N*M number of fuse sets 310a, 310b, ..., 310m are valid by the unit of M number. That is the N*M number of fuse status signals outputted from the first to $M^{th}$ fuse sets 310a, 310b, ..., 310m included in the N number of respective fuse arrays 302a, 302b, ..., 302n are divided N number of times by the unit of M number, and whether or not the respective M numbers of fuse status signals are valid is determined N number of times. If each M number of fuse status signals are valid, the valid fuse status signal outputted from the valid fuse sets 300a corresponding to each M number of fuse status signals will become a logic high level. Conversely, if each M number of fuse status signals are partially invalid, the valid fuse status signal outputted from the valid fuse sets 300a corresponding to each M number of fuse status signals will become a logic low level. For example, if an invalid fuse status signal is included in the seventh M number of fuse status signals among the N*M number of fuse status signals outputted from the first to $M^{th}$ fuse sets 310a, 310b, ..., 310m included in the N number of respective fuse arrays 302a, 302b, ..., 302n, the seventh fuse status signal outputted from the seventh valid fuse set 300a corresponding to the seventh M number of fuse status signals will become the logic low level, and the remaining N−1 number of fuse status signals outputted from the remaining N−1 number of valid fuse sets 300a will become the logic high level.

The validities of the M numbers of fuse sets 310a, 310b, ..., 310m included in the N number of respective fuse arrays 302a, 302b, ..., 302n may be determined according to the N number of valid fuse status signals outputted from the N number of valid fuse sets 300a.

The values of the N number of valid fuse status signals outputted from the N number of valid fuse sets 300a included in the N number of fuse arrays 302a, 302b, ..., 302c may be determined through a test during the course of fabricating a semiconductor device. Whether or not the N number of valid fuse sets 300a are included in the N number of fuse arrays 302a, 302b, ..., 302n may be determined during fabrication. That is a configuration may be made so that only the M numbers of fuse sets 310a, 310b, ..., 310m are included and the valid fuse sets 300a are not included in the N number of fuse arrays 302a, 302b, ..., 302n. In the case where the valid fuse sets 300a are not included, it may not be determined whether or not the M numbers of fuse sets 310b, 310c, ..., 310m included in the N number of respective fuse arrays 302a, 302b, ..., 302n are valid.

The code counter 350 may count selection codes SEL1:M in a preset order by the M number of times in response to the enable signal FZXEN and the operation clock AFCLK0, and is initialized in response to a group selection signal BKSEL. In this way, the selection codes, which are counted in the preset order by the M number of times in the code counter 350, selectively enable the M numbers of selectors 331a, 331b, ..., 331m, which are included in the N numbers of storage blocks 313a, 313b, ..., 313n, and the M numbers of latches 341a, 341b, ..., 341m, which are included in the N numbers of storage blocks 314a, 314b, ..., 314n, in a repeated manner by the unit of M number through N number of times.

In summary, the code counter 350 operates so that an operation for changing the values of the selection codes in the preset order by the M number of times may be repeated by the N number of times in response to toggling of the operation clock AFCLK0 transmitted from the clock buffer 301. As the operation for changing the values of the selection codes in the preset order by the M number of times is repeated by the N number of times in this way, the M numbers of selectors 331a, 331b, ..., 331m and the M numbers of latches 341a, 341b, ..., 341m included in the N numbers of storage blocks 313a, 313b, ..., 313n and 314a, 314b, ..., 314n are enabled one by one and store the N*M number of fuse status signals.

A reason why the operation for changing the values of the selection codes counted in the code counter 350, in the preset order by the M number of times, may be repeated by the N number of times is because the code counter 350 initializes a counting operation in response to the group selection signal such as BKSEL. That is, the code counter 350 performs a first operation of changing the values of the selection codes through performing the counting operation each time the operation clock AFCLK0 toggles during the activation period of the enable signal FZXEN and a second operation of initializing the values of the selection codes through initializing the counting operation each time any one storage block is selected among the N numbers of storage blocks 313a, 313b, . . . , 313n by the group selection signal BKSEL. For example, the code counter 350 initially changes the values of the selection codes by the M number of times in response to toggling of the operation clock AFCLK0, the M number of selectors 331a, 331b, . . . , 331m and the M number of latches 341a, 341b, . . . , 341m included in the first storage blocks 313a and 314a among the N numbers of storage blocks 313a, 313b, . . . , 313n and 314a, 314b, . . . , 314n are enabled one by one and store the fuse status signals outputted from the first fuse set 310a, . . . , 310m in the fuse array 302a among the M numbers of fuse sets 310a, 310b, . . . , 310m in the N number of fuse arrays 302a, 302b, . . . , 302n, respectively. In this way, if the M number of selectors 331a, 331b, . . . , 331m and the M number of latches 341a, 341b, . . . , 341m included in the first storage blocks 313a and 314a are all enabled, after the values of the selection codes are initialized as the value of the group selection signal BKSEL is changed and the code counter 350 is initialized, the values of the selection codes are changed again by the M number of times in response to toggling of the operation clock AFCLK0. The values of the selection codes are secondly changed by the M number of times in this way, the M number of selectors 331a, 331b, . . . , 331m and the M number of latches 341a, 341b, . . . , 341m included in the second storage blocks 313b and 314b are enabled one by one and store the fuse status signals outputted from the fuse sets 310a, 310b, . . . , 310m in the second fuse array 302b among the M numbers of fuse sets 310a, 310b, . . . , 310m in the fuse arrays 302a, 302b, . . . , 302n. As a result of the operation of changing the values of the selection codes by the M number of times repeatedly performed through the N number of times by the code counter 350, the M numbers of selectors 331a, 331b, . . . , 331m and the M numbers of latches 341a, 341b, . . . , 341m included in the N numbers of storage blocks 313a, 313b, . . . , 313n and 314a, 314b, . . . , 314n are enabled one by one and store one by one the N*M number of fuse status signals outputted from the M numbers of fuse sets 310a, 310b, . . . , 310m in the fuse arrays 302a, 302b, . . . , 302n.

The M numbers of selectors 331a, 331b, . . . , 331m included in the N number of respective storage blocks 313a, 313b, . . . , 313n determine whether or not to activate N*M number of storage enable signals in response to the selection codes counted in the code counter 350 in the case where the N number of valid fuse status signals outputted from the N number of valid fuse sets 300a are valid, so that the M numbers of latches 341a, 341b, . . . , 341m included in the N number of respective storage blocks 314a, 314b, . . . , 314n are selectively enabled. FIG. 6 illustrates a detailed configuration of each of the M numbers of selectors 331a, 331b, . . . , 331m included in the N number of respective storage blocks 313a, 313b, . . . , 313n. That is, in the state in which the N*M number of storage enable signals are initialized to a logic low level in response to a reset signal RSTB, the N*M number of storage enable signals are sequentially activated to a logic high level in response to that the N number of valid fuse status signals outputted from the N number of valid fuse sets 300a in the N number of fuse arrays 302a, 302b, . . . , 302n and become valid as the logic high level and at the same time the selection codes SEL1:M are activated to a logic high level in a preset order.

Since the N number of valid fuse status signals applied to the N*M number of selectors 331a, 331b, . . . , 331m by the unit of M number serve as references for determining whether the N*M number of fuse status signals are valid by the unit of M number or not, if an invalid signal exists in the N number of valid fuse status signals, it is not necessary to store the M number of fuse status signals corresponding to the valid fuse status signal that is invalid. Accordingly, when the N*M number of selectors 331a, 331b, . . . , 331m are divided into N number of groups by the unit of M number and the N number of groups correspond to the N number of valid fuse status signals, a group corresponding to the valid fuse status signal that is invalid among the N number of valid fuse status signals does not perform any operation regardless of the values of the selection codes. That is, only groups corresponding to valid fuse status signals, which are valid among the N number of valid fuse status signals, perform operations of activating the N*M number of storage enable signals, in response to the values of the selection codes. The detailed configuration, illustrated in FIG. 6, of each of the M numbers of selectors 331a, 331b, . . . , 331m included in the N number of respective storage blocks 313a, 313b, . . . , 313n is an exemplary embodiment and may have different configurations.

The M numbers of latches 341a, 341b, . . . , 341m included in the N number of respective storage blocks 314a, 314b, . . . , 314n store N*M number of fuse status signals outputted from the N*M number of fuse sets 310a, 310b, . . . , 310m in the fuse arrays 302a, 302b, . . . , 302n, in response to the storage enable signals outputted from the M numbers of selectors 331a, 331b, . . . , 331m included in the N number of respective storage blocks 313a, 313b, . . . , 313n. FIG. 7 may be referred to for a detailed configuration of each of the N*M number of latches 341a, 341b, . . . , 341m. That is, when the N*M number of storage enable signals FEN are activated to the logic high level in the preset order on the basis of a save value SAVE_DATA, which is initialized to a logic high level in response to the reset signal RSTB, whether to store the save value SAVE_DATA as the logic high level or a logic low level is determined in response to the N*M number of fuse status signals. The detailed configuration, illustrated in FIG. 7, of each of the M numbers of latches 341a, 341b, . . . , 341m included in the N number of storage blocks 314a, 314b, . . . , 314n is an exemplary embodiment and may have different configurations.

As described above, the storage circuit for storing fuse options sequentially stores the N*M number of fuse status signals the levels of which are determined through whether the fuses included in the M numbers of fuse sets 310a, 310b, . . . , 310m included in the N number of respective fuse arrays 302a, 302b, . . . , 302n are cut or not, in the N*M number of latches 341a, 341b, . . . , 341m.

While a component element for generating the enable signal FZXEN is not directly shown in FIG. 3, the activation period of the enable signal FZXEN may be defined on the basis of the fact that the operation of the storage circuit for storing fuse options is performed at an initial operation period. That is the enable signal FZXEN is activated in response to a power-up signal (not shown) indicating a time at which an internal voltage of a semiconductor device is stabilized, and is deactivated after all the M numbers of selectors 331a, 331b, . . . , 331m and the M numbers of latches 341a, 341b, . . . , 341m included in the N numbers of storage blocks 313a, 313b, . . . , 313n and 314a, 314b, . . . , 314n are selected by one time and thus all the N*M number of fuse status signals are stored.

In the storage circuit for storing fuse options illustrated in FIG. 3, to sequentially select the N*M number of latches 341a, 341b, ..., 341m included in the N number of respective storage blocks 314a, 314b, ..., 314n for storing the N*M number of fuse status signals, the process of repeating the operation of counting the selection codes SEL1:M in the code counter 350 by M number of times in response to the inputted operation clock AFCLK0, through N number of times, is used.

The code counter 350 always has the same size regardless of the values of numbers N and M. In the storage circuit for storing fuse options illustrated in FIG. 3, an area to be occupied is not changed because it is only necessary for the code counter 350 to perform a counting operation even though the numbers N and M may increase.

As is apparent from the above descriptions, when the embodiments according to the present invention are applied, a large number of fuse options may be efficiently and quickly stored through shifting the selection signals for storing the fuse options, in a preset order in response to toggling of the operation clock AFCLK0.

Advantageously, a large number of fuse options may be efficiently and quickly stored and an area to be occupied by the storage circuit may be minimized through a scheme of counting selection codes for storing the fuse options, in a preset order in response to toggling of the operation clock AFCLK0.

Although various embodiments have been described for illustrative purposes, it will be apparent to those skilled in the art that various changes and modifications may be made without departing from the spirit and scope of the invention as defined in the following claims.

For instance, positions and kinds of the logic gates and transistors exemplified in the above-described embodiment may be differently realized according to the polarities of the signals inputted thereto.

What is claimed is:

1. A semiconductor device comprising:
   a fuse array having one valid fuse set which outputs a valid fuse status signal and a plurality of fuse sets, the fuse array suitable for outputting a plurality of fuse status signals having different levels according to whether fuses in the plurality of fuse sets are cut or not;
   a code counter suitable for counting selection codes in a preset order in response to an enable signal and an operation clock; and
   a plurality of storage blocks suitable for receiving and storing the plurality of fuse status signals in a preset order in response to the selection codes,
   wherein the storage block comprises:
      a plurality of latches suitable for storing the plurality of fuse status signals; and
      a plurality of selectors suitable for enabling any of the plurality of latches in response to the selection codes,
   wherein each of the plurality of selectors is on/off controlled in its operation in response to the valid fuse status signal regardless of values of the selection codes.

2. The semiconductor device according to claim 1, wherein the enable signal is activated in a power-up mode, and is deactivated after all of the plurality of selectors and the plurality of latches are selected by one time, and the plurality of fuse status signals are stored.

3. The semiconductor device according to claim 1, wherein a level of the valid fuse status signal is determined according to whether a fuse of the valid fuse set is cut or not.

4. A semiconductor memory device comprising:
   a plurality of banks;
   a plurality of fuse arrays having a plurality of fuse sets, which correspond to the plurality of banks, and suitable for outputting a plurality of fuse status signals which have different levels according to whether fuses of the plurality of fuse sets are cut or not;
   a code counter suitable for counting selection codes in a preset order in response to an enable signal and an operation clock, and to be initialized in response to a group selection signal; and
   a plurality of storage blocks suitable for receiving and storing the plurality of fuse status signals in a preset order according to the group selection signal and the selection codes,
   wherein the plurality of storage blocks comprise:
      a plurality of latches suitable for storing the plurality of fuse status signals; and
      a plurality of selectors suitable for being divided into a plurality of groups according to the group selection signal, and suitable for enabling the plurality of latches in a preset order in response to the selection codes in selected groups,
   wherein the fuse array additionally includes a number of valid fuse sets corresponding to the plurality of banks, in addition to the plurality of fuse sets, and
   wherein the plurality of fuse arrays is suitable for outputting a number of valid fuse status signals of a level determined according to whether fuses of the valid fuse sets are cut or not,
   wherein each of the plurality of selectors is on/off controlled in an operation of each of the plurality of groups in response to each of the plurality of valid fuse status signals regardless of the values of the selection codes.

5. The semiconductor memory device according to claim 4, wherein, in the plurality of selectors, the plurality of groups are respectively selected in the preset order in response to the group selection signal, and selected groups enable the plurality of latches in the preset order in response to the selection codes, such that, when the plurality of groups are selected by one time, all of the plurality of latches are enabled by one time.

6. The semiconductor memory device according to claim 5, wherein the code counter changes values of the selection codes by performing a counting operation each time the operation clock toggles during an activation period of the enable signal, and initializes the values of the selection codes by initializing the counting operation each time any one group is selected among the plurality of groups by the group selection signal.

7. The semiconductor memory device according to claim 4, wherein the enable signal is activated in a power-up mode, and is deactivated after all of the plurality of selectors and the plurality of latches are selected by one time and the plurality of fuse status signals are stored.

* * * * *